United States Patent
Hirose

(10) Patent No.: US 9,868,672 B2
(45) Date of Patent: Jan. 16, 2018

(54) CERAMIC MATERIAL

(71) Applicant: Murata Manufacturing Co., Ltd., Kyoto (JP)

(72) Inventor: Sakyo Hirose, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/406,850

(22) Filed: Jan. 16, 2017

(65) Prior Publication Data

US 2017/0121229 A1 May 4, 2017

Related U.S. Application Data

(63) Continuation of application No. PCT/JP2015/067070, filed on Jun. 12, 2015.

(30) Foreign Application Priority Data

Jul. 17, 2014 (JP) ................. 2014-146839

(51) Int. Cl.
| | |
|---|---|
| C04B 35/495 | (2006.01) |
| C01G 31/02 | (2006.01) |
| F25B 21/00 | (2006.01) |
| F25B 23/00 | (2006.01) |
| F28D 20/00 | (2006.01) |
| F28F 21/04 | (2006.01) |
| H05K 7/20 | (2006.01) |

(52) U.S. Cl.
CPC ............ *C04B 35/495* (2013.01); *C01G 31/02* (2013.01); *F25B 21/00* (2013.01); *F25B 23/00* (2013.01); *F28D 20/00* (2013.01); *F28F 21/04* (2013.01); *H05K 7/2039* (2013.01)

(58) Field of Classification Search
CPC .............................. C04B 35/495; C01G 31/02
See application file for complete search history.

(56) References Cited

U.S. PATENT DOCUMENTS

| 2008/0118840 A1 | 5/2008 | Yew et al. |
| 2014/0085044 A1 | 3/2014 | Hirose |

FOREIGN PATENT DOCUMENTS

| CN | 1279211 A | 1/2001 |
| JP | 556-042098 A | 4/1981 |
| JP | H10-092987 A | 4/1998 |
| JP | 2002-162182 A | 6/2002 |
| JP | 2008-130571 A | 6/2008 |
| JP | 2010-080173 A | 4/2010 |
| JP | 2010-163510 A | 7/2010 |
| JP | 2010-223497 A | 10/2010 |
| JP | 2013-084710 A | 5/2013 |
| NO | 2012-133074 A1 | 10/2012 |

OTHER PUBLICATIONS

J. B. Goodenough, et al., Lattice Instabilities Near the Critical V—V Separation for Localized Versus Itinerant lectrons in LiV1—yMyO2 (M=Cr or Ti) Li1—xVO2, Physical Review B: Condensed Matter and Materials Physics, May 1, 1991, vol. 43, No. 13, pp. 10170-10178.

I. Takahashi, et al. "Thermochromic Properties of Double-Doped VO2 Thin Films Prepared by a Wet Coating Method Using Polyvanadate-Based Sols Containing W and Mo or W and Ti", The Japan Society of Applied Physics, vol. 10, Mar. 2001, pp. 1391-1395.

K. Takao, et al., "Li Local Configurations for the Trimerized State of the Geometrically Frustrated Triangular Lattice System Li1—xV O2 with 0≤x≤0.14", Journal of Physics, Condensed Matter, vol. 22, Feb. 23, 2010, pp. 1-8.

International Search Report issued in Patent Application No. PCT/JP2015/067070 dated Aug. 11, 2015.

Written Opinion issued in Patent Application No. PCT/JP2015/067070 dated Aug. 11, 2015.

*Primary Examiner* — Karl Group

(74) *Attorney, Agent, or Firm* — Pearne & Gordon LLP

(57) ABSTRACT

The present disclosure provides a ceramic material containing a vanadium oxide, and 50 to 400 ppm by mass of nitrogen with respect to the vanadium oxide. The ceramic material according to the present disclosure less varies in the amount of heat absorption. A cooling device comprising the ceramic material is also provided.

20 Claims, No Drawings

CERAMIC MATERIAL

This is a continuation of International Application No. PCT/JP2015/067070 filed on Jun. 12, 2015 which claims priority from Japanese Patent Application No. 2014-146839 filed on Jul. 7, 2014. The contents of these applications are incorporated herein by reference in their entireties.

BACKGROUND OF THE DISCLOSURE

Field of the Disclosure

The present disclosure relates to a ceramic material, more particularly, a ceramic material containing a vanadium oxide.

Description of the Related Art

On the background of the performance improvement for electronic devices in recent years, the number of electronic components has been increased, such as CPUs (central processing units), power amplifiers, FETs (field-effect transistors), ICs (integrated circuits), and voltage regulators which serve as heat sources, with the result that energy input has been also increased, thereby leading to a significant issue with heat generation. In particular, mobile devices such as smartphones and tablet terminals have, due to the heat, the problem of degrading the battery capacities, or seriously affecting the reliability of constituent electronic devices. Therefore, more advanced control of the temperatures in the devices has been required.

The heat generated from the heat sources as mentioned above is controlled by a cooling fan, a heat pipe, a heat sink, a thermal sheet, a Peltier element, or the like as an existing heat management solution, and for example, Patent Document 1 discloses a cooling system that has a heat sink in combination with a fan or a Peltier element (see Patent Document 1).

However, the cooling system that has a heat sink in combination with a fan or a Peltier element as mentioned above has a relatively complex structure, and additionally increases device sizes, and it is hard to use the system, in particular, for thin devices such as smartphones and tablet terminals. Moreover, because of power consumption, the system is also disadvantageous from the perspective of low power consumption (how long the battery lasts).

Therefore, for thin devices such as smartphones and tablet terminals, currently, there is only a means for temperature control with heat release through housings, and the escape of heat is achieved by thermally coupling the heat sources and the housings with thermal sheets or the like.

Patent Document 1: Japanese Patent Application Laid-Open No. 2010-223497

BRIEF SUMMARY OF THE DISCLOSURE

The heat release through the housing as mentioned above is limited by the limited surface area of the housings. Therefore, the temperature of each heat source is measured, and when the temperature reaches a predetermined temperature or higher, the performance of a CPU or the like is limited (the heat generation itself is suppressed), thereby dealing with the temperature. More specifically, the increased temperatures of the housings may interfere with the performance of a CPU or the like. Obviously, this heat release through the housings, in other words, heat release through heat transfer to the whole devices, also transfers heat to batteries, which can also be considered as leading to deceases in battery capacity with the passage of time.

Therefore, the inventor has considered a ceramic material that absorbs heat with crystal-structural phase transition, magnetic phase transition, or the like, which is disposed near a heat source for an electronic device, thereby providing a cooling device that is usable without any power source. The inventor has studied the use of vanadium oxide as such a ceramic material. As a result, it has been demonstrated that the vanadium oxide (typically, vanadium dioxide) contains inevitable cation impurities such as Fe, Ca, Si, and Mo, which greatly affect the heat absorption effect. The cation impurities, which are derived from the raw materials, vary in amount depending on raw material lots. It has been found that under the influence of the variability in the impurity amount, the vanadium oxide also varies in the amount of heat absorption. This variability, which reaches several tens J/g, may be problematic in the case of using the vanadium oxide for a cooling device.

Therefore, an object of the present disclosure is to provide a ceramic material containing, as its main constituent, a vanadium oxide which varies little in the amount of heat absorption.

The inventor has, as a result of a further review in order to solve the problem mentioned above, found that a ceramic material including a vanadium oxide contains 50 to 400 ppm by mass of nitrogen, thereby reducing variability in the amount of heat absorption, and achieved the disclosure.

According to a first aspect of the present disclosure, a ceramic material is provided which is characterized in that the ceramic material contains a vanadium oxide and 50 to 400 ppm by mass of nitrogen with respect to the vanadium oxide.

According to a second aspect of the present disclosure, a method for reducing variability in amount of heat absorbed by a ceramic material containing, as its main constituent, a vanadium oxide is provided, which is characterized in that the ceramic material contains therein 50 to 400 ppm by mass of nitrogen with respect to the vanadium oxide.

According to a third aspect of the present disclosure, a cooling device is provided which includes the ceramic material mentioned above.

According to a fourth aspect of the present disclosure, an electronic component is provided which includes the cooling device mentioned above.

According to a fifth aspect of the present disclosure, an electronic device is provided which includes the cooling device or electronic component mentioned above.

According to the present disclosure, the ceramic material containing, as its main constituent, a vanadium oxide contains 50 to 400 ppm by mass of nitrogen with respect to the vanadium oxide, thereby making it possible to provide a ceramic material which varies little in the amount of heat absorption.

DETAILED DESCRIPTION OF THE DISCLOSURE

The ceramic material according to the present disclosure absorbs heat for latent heat. This ceramic material temporarily absorbs excess heat for latent heat, thereby achieving the temporal leveling of heat, and thus making it possible to achieve a great cooling effect.

The ceramic material mentioned above contains, as its main constituent, a vanadium oxide that absorbs heat with latent heat. The vanadium oxide mentioned above has only to contain vanadium and oxygen, and encompasses, for example, composite oxides and oxides doped with other elements.

In this regard, the main constituent means to a 50 mass % or more constituent included in the ceramic material, in particular, a 60 mass % or more, preferably 80 mass % or more, more preferably 90 mass % or more, and further preferably 98 mass % or more, for example, 98.0 to 99.8 mass % constituent included therein.

The other constituents are not particularly limited, but include other ceramic materials, for example, glass, as well as Na, Al, Cr, Fe, Ni, Mo, Sb, Ca, Si, and oxides thereof included as impurities.

The other elements mentioned above are not particularly limited as long as the vanadium oxide can contain the elements as doping elements, but include, for example, W, Ta, Mo, and Nb.

The vanadium oxide preferably has an amount of latent heat of 5 J/g or more, more preferably 20 J/g or more, and further preferably 40 J/g or more. With this large amount of latent heat, a great cooling effect can be produced in a smaller volume, which is advantageous in terms of reduction in size. The "latent heat" herein refers to the total amount of heat energy required when the phase of a substance is changed, and in this specification, refers to the amount of heat absorption or heat generation associated with a solid-solid phase transition, for example, an electric/magnetic/structural phase transition.

The vanadium oxide included in the ceramic material according to the present disclosure may be a vanadium oxide including vanadium and M (where M is at least one selected from W, Ta, Mo, and Nb), where the M content in parts by mol is 0 parts by mol or more and approximately 5 parts by mol or less when the vanadium and the M are regarded as 100 parts by mol in total. It is to be noted that M is not an essential constituent, and the content of M in parts by mol may be 0.

Alternatively, the vanadium oxide included in the ceramic material according to the present disclosure may be a composite oxide including A (where A is Li or Na) and vanadium, where the A content in parts by mol is approximately 50 parts by mol or more and approximately 110 parts by mol or less, preferably approximately 70 parts by mol or more and approximately 110 parts by mol or less, more preferably approximately 70 parts by mol or more and approximately 98 parts by mol or less when the vanadium is regarded as 100 parts by mol.

Furthermore, the vanadium oxide included in the ceramic material according to the present disclosure may be a composite oxide including A (where A is Li or Na), vanadium, and a transition metal (for example, at least one selected from titanium, cobalt, iron, and nickel), characterized in that:

the molar ratio between the vanadium and the transition metal falls within the range of 995:5 to 850:150, and the molar ratio between the total of the vanadium and the transition metal, and A falls within the range of 100:70 to 100:110.

In addition, in another aspect, the vanadium oxide included in the ceramic material according to the present disclosure may have one or more vanadium oxides represented by the following formula:

$V_{1-x}M_xO_2$ (in the formula, M is W, Ta, Mo, or Nb, and x is 0 or more and 0.05 or less)
or the following formula:

$A_yV_{1-z}M^a_zO_2$ (in the formula, A is Li or Na, and $M^a$ is a transition metal; and y is 0.5 or more and 1.1 or less, y is preferably 0.7 or more and 1 or less, and z is 0 or more and 0.15 or less)

In the formula, A is preferably Li. In addition, preferably, $M^a$ is at least one metal selected from titanium, cobalt, iron, and nickel.

In a preferred aspect, in the formula, y and z meet the following (a) or (b):
(a) $0.70 \leq y \leq 0.98$, and z=0; or
(b) $0.70 \leq y \leq 1.1$, and $0.005 \leq z \leq 0.15$ In a preferred aspect, the vanadium oxide included in the ceramic material according to the present disclosure may have one or more vanadium oxides represented by the following formula:

$V_{1-x}M_xO_2$ (in the formula, M is W, Ta, Mo, or Nb, and x is 0 or more and 0.05 or less)

In a more preferred aspect, the vanadium oxide included in the ceramic material according to the present disclosure may have one or more vanadium oxides represented by the following formula:

$V_{1-x}W_xO_2$ (in the formula, x is 0 or more and 0.01 or less)

In another preferred aspect, the vanadium oxide included in the ceramic material according to the present disclosure is a vanadium oxide doped with Ti, or further doped with another atom selected from the group consisting of W, Ta, Mo, and Nb, when the another atom is W, the content of the another atom in parts by mol is more than 0 parts by mol and 5 parts by mol or less with respect to 100 parts by mol in total of the vanadium, the Ti, and the another atom, when the another atom is Ta, Mo, or Nb, the content of the another atom in parts by mol is more than 0 parts by mol and 15 parts by mol or less with respect to 100 parts by mol in total of the vanadium, the Ti, and the another atom, and the titanium content in parts by mol is 2 parts by mol or more and 30 parts by mol or less with respect to 100 parts by mol in total of the vanadium, the Ti, and the another atom. The use of the vanadium oxide improves the moisture resistance of the ceramic material.

In a preferred aspect, in the vanadium oxide doped with Ti, the titanium content in parts by mol is 5 parts by mol or more and 10 parts by mol or less with respect to 100 parts by mol in total of the Ti and the another atom.

In another preferred aspect, the vanadium oxide included in the ceramic material according to the present disclosure is a vanadium oxide represented by
the following formula: $V_{1-x-y}Ti_xM_yO_2$
[in the formula, M is W, Ta, Mo, or Nb,
x is 0.02 or more and 0.30 or less,
y is 0 or more, and
y is 0.05 or less when M is W, or
y is 0.15 or less when M is Ta, Mo, or Nb]
The use of the vanadium oxide improves the moisture resistance of the ceramic material.

Preferably, in the formula, x can be 0.05 or more and 0.10 or less.

The temperature indicating the latent heat of the vanadium oxide, that is, the temperature at which the vanadium oxide undergoes a phase transition can be adjusted by adding another element (doping), and adjusting the additive amount of the element. In the formula, the temperature at which the latent heat is provided can be adjusted by adjusting the content of M or $M^a$.

For example, when the vanadium oxide is represented by the following formula:

$$V_{1-x}W_xO_2$$

the phase transition takes place at approximately 50° C. with x of 0.005, and the phase transition takes place at approximately 40° C. with x of 0.01.

The temperature at which the vanadium oxide undergoes a phase transition is selected appropriately depending on objects to be cooled, purposes, or the like, and for example, when the object to be cooled is a CPU, the vanadium oxide preferably undergoes the phase transition at 20 to 100° C., preferably 40 to 60° C. during temperature rising. This vanadium oxide is not to be considered limited, but examples thereof include the vanadium oxide represented by $V_{1-x}M_xO_2$ mentioned above. In addition, when the object to be cooled is a lithium ion battery, the vanadium oxide preferably undergoes the phase transition at 70 to 230° C., preferably 100 to 180° C. during temperature rising. This vanadium oxide is not to be considered limited, but examples thereof include the vanadium oxide represented by $A_yV_{1-z}M^a_zO_2$ mentioned above.

The ceramic material according to the present disclosure contains 50 to 400 ppm by mass of nitrogen (nitrogen atoms) with respect to the vanadium oxide. Preferably, the nitrogen is present in the vanadium oxide. It is to be noted that the vanadium oxide may include inevitable impurities derived from the raw material, for example, cation impurities, but the impurities in extremely minute amounts can be ignored in the measurement of the nitrogen concentration.

The nitrogen concentration can be calculated from the measured contents of the vanadium oxide and nitrogen in the ceramic material. The content of the vanadium oxide can be calculated from the weight of the ceramic material and the result of measuring the proportion of the vanadium oxide through observation of a crystalline phase in the ceramic material by an X-ray diffraction method. The content of the nitrogen can be measured, for example, by a titration method, or with a nitrogen oxide concentration meter ($NO_x$ meter).

The nitrogen included in the ceramic material is not limited on how the material contains the nitrogen, but for example, may be present to substitute oxygen sites of the vanadium oxide, or can be present between lattices of the vanadium oxide.

The ceramic material according to the present disclosure is preferably particulates (powdery). The average particle size (D50: the particle size at the point of a cumulative value corresponding to 50% on a cumulative curve with the total volume regarded as 100% in regard to a particle size distribution obtained on a volumetric basis) of the ceramic material is not particularly limited, but for example, 0.1 to several hundred μm, specifically, 0.1 to 900 μm, typically approximately 0.2 to 50 μm, preferably 0.5 to 50 μm. The average particle size can be measured with the use of a laser diffraction-laser scattering particle size-particle size distribution measurement system or an electron scanning microscope. The particle size is preferably 0.2 μm or more from the perspective of ease of handling, and preferably 50 μm or less from the perspective of being capable of denser forming.

The above-mentioned ceramic material according to the present disclosure can be formed into desired shapes, for example, a sheet, a block, and various other shapes. The forming method is not particularly limited, but compression, sintering, and the like can be used. In addition, the material may be mixed with a binder such as a resin or glass, and formed into the shapes. Furthermore, the material may be mixed with a fluid resin or the like to provide a paste.

The ceramic material according to the present disclosure contains 50 to 400 ppm by mass of nitrogen, thereby reducing the influence of inevitable impurities, and reducing the variation in the amount of heat absorption among manufacturing lots.

Accordingly, the present disclosure also provides a method for reducing variability in amount of heat absorption for latent heat of a ceramic material containing, as its main constituent, a vanadium oxide is provided, which is characterized in that the ceramic material contains therein 50 to 400 ppm by mass of nitrogen with respect to the vanadium oxide.

The vanadium oxide for use in the method according to the present disclosure may be the same vanadium oxide included in the ceramic material described above.

Specifically, for example, the vanadium oxide for use in the method according to the present disclosure can be: a vanadium oxide including vanadium and M (where M is at least one selected from W, Ta, Mo, and Nb), where the M content in parts by mol is 0 parts by mol or more and approximately 5 parts by mol or less when the vanadium and the M are regarded as 100 parts by mol in total;

a composite oxide including A (where A is Li or Na) and vanadium, where the A content in parts by mol is approximately 50 parts by mol or more and approximately 110 parts by mol or less, preferably approximately 70 parts by mol or more and approximately 110 parts by mol or less, more preferably approximately 70 parts by mol or more and approximately 98 parts by mol or less when the vanadium is regarded as 100 parts by mol; or a composite oxide including A (where A is Li or Na), vanadium, and a transition metal (for example, at least one selected from titanium, cobalt, iron, and nickel), where the molar ratio between the vanadium and the transition metal falls within the range of 995:5 to 850:150, and the molar ratio between the total of the vanadium and the transition metal, and A falls within the range of 100:70 to 100:110.

Alternatively, for example, the vanadium oxide for use in the method according to the present disclosure may have one or more vanadium oxides represented by the following formula:

$$V_{1-x}M_xO_2$$

(in the formula, M is W, Ta, Mo, or Nb, and x is 0 or more and 0.05 or less)
or the following formula:

$$A_yV_{1-z}M^a_zO_2$$

(in the formula, A is Li or Na, and $M^a$ is a transition metal; and y is 0.5 or more and 1.1 or less, y is preferably 0.7 or more and 1 or less, and z is 0 or more and 0.15 or less)

In another preferred aspect, the vanadium oxide for use in the method according to the present disclosure is a vanadium oxide doped with Ti, or further doped with another atom selected from the group consisting of W, Ta, Mo, and Nb, when the another atom is W, the content of the another atom in parts by mol is more than 0 parts by mol and 5 parts by mol or less with respect to 100 parts by mol in total of the vanadium, the Ti, and the another atom, when the another atom is Ta, Mo, or Nb, the content of the another atom in parts by mol is more than 0 parts by mol and 15 parts by mol or less with respect to 100 parts by mol in total of the vanadium, the Ti, and the another atom, and the titanium content in parts by mol is 2 parts by mol or more and 30 parts by mol or less with respect to 100 parts by mol in total of the vanadium, the Ti, and the another atom. The use of the vanadium oxide improves the moisture resistance.

In a preferred aspect, in the vanadium oxide doped with Ti, the titanium content in parts by mol is 5 parts by mol or more and 10 parts by mol or less with respect to 100 parts by mol in total of the Ti and the another atom.

In another preferred embodiment, the vanadium oxide for use in the method according to the present disclosure is a vanadium oxide represented by
the following formula: $V_{1-x-y}Ti_xM_yO_2$
[in the formula, M is W, Ta, Mo, or Nb,
x is 0.02 or more and 0.30 or less,
y is 0 or more, and
y is 0.05 or less when M is W, or
y is 0.15 or less when M is Ta, Mo, or Nb]
The use of the vanadium oxide improves the moisture resistance.

Preferably, in the formula, x can be 0.05 or more and 0.10 or less.

The method for causing the ceramic material according to the present disclosure to contain nitrogen is not particularly limited, but examples thereof include, for example, methods such as using a nitrogen-containing substance (for example, ammonium metavanadate ($NH_4VO_3$)) as a raw material, firing the vanadium oxide along with a nitride (for example, vanadium nitride (VN)), applying heat treatment under an ammonium atmosphere, and carrying out exposure to a high-pressure nitrogen atmosphere. In addition, the content of nitrogen can be controlled by applying heat treatment to a vanadium oxide containing a high concentration of nitrogen.

The conditions for the methods mentioned above, for example, temperature, time, pressure, and atmosphere can be determined appropriately by one skilled in the art, depending on the target nitrogen concentration, the valence of vanadium, the shape of the ceramic material, and the like.

For example, in the case of applying heat treatment to ammonium metavanadate, thereby preparing a vanadium dioxide, the target nitrogen concentration can be achieved by heat treatment under the atmosphere with the treatment time and treatment temperature respectively adjusted in the ranges of 30 minutes to 4 hours and 600 to 800° C. The increased treatment time can accelerate the decomposition of the nitrogen constituent to achieve a vanadium oxide with a lower nitrogen concentration, whereas the decreased treatment time can achieve a vanadium oxide with a higher nitrogen concentration. In addition, the treatment temperature can also control the nitrogen concentration, and the treatment at a higher temperature can make the nitrogen concentration lower, whereas the treatment at a lower temperature can make the nitrogen concentration higher.

As another method, a vanadium oxide containing a high concentration of nitrogen is subjected to heat treatment at, for example, 400° C. or higher, for example, 400 to 800° C. while controlling the oxygen partial pressure with the use of a gas such as $N_2/H_2/H_2O$, $N_2$, or $H_2/Air/N_2$, thereby causing nitrogen desorption, and thus achieving the target nitrogen concentration.

The ceramic material according to the present disclosure varies little in the amount of heat absorption among manufacturing lots as mentioned above, and can be thus used in a preferred manner as heat storage, cooling, and heat-retention devices.

Accordingly, the present disclosure also provides a cooling device including the ceramic material mentioned above.

The shape of the cooling device according to the present disclosure is not particularly limited, but can be any shape.

In an aspect, the cooling device according to the present disclosure can have the shape of a block. The adoption of the shape of a block increases the overall volume, thereby making it possible to absorb more heat. In addition, in another aspect, the cooling device according to the present disclosure can have the shape of a sheet. The adoption of the shape of a sheet increases the surface area, thus making absorbed heat likely to be released to the outside.

The cooling device according to the present disclosure may have other members, for example, a protective cover that protects the cooling device, a thermal conductive part such as a metal for enhancing thermal conductivity, an insulating sheet for ensuring insulation, a member (for example, an adhesive sheet, a pin, a nail) for installation in an electronic device.

In addition, the present disclosure also provides an electronic component including the cooling device according to the present disclosure, and an electronic device including the cooling device or the electronic component.

The electronic component is not to be considered particularly limited, but examples thereof include components commonly used in electronic devices such as, for example, integrated circuits (ICs), e.g., a central processing unit (CPU), a power management IC (PMIC), a power amplifier (PA), a transceiver IC, and a voltage regulator (VR); light-emitting elements such as a light emitting diode (LED), an incandescent light bulb, and a semiconductor laser; components which can be heat sources, e.g., a field-effect transistors (FET); and other components, e.g., a lithium ion battery, a substrate, a heat sink, a housing.

The electronic device is not to be considered particularly limited, but examples thereof include, for example, a cellular phone, a smartphone, a personal computer (PC), a tablet terminal, and a hard disc drive.

EXAMPLE

Manufacturing Example

Prepared were three types (raw materials 1 to 3) of ammonium metavanadates (AMV: chemical formula $NH_4VO_3$) containing impurities as shown in Table 1 below. The impurities included in the raw materials were evaluated with the use of an inductively-coupled plasma atomic emission spectrometer (ICP-AES) and an inductively-coupled plasma mass spectrometer (ICP-MS). As shown in Table 1, it is determined that the three types of raw materials 1 to 3 used include impurities which vary in amount. The respective raw materials were decomposed/oxidized by heat treatment, thereby preparing various vanadium dioxides ($VO_2$) with different nitrogen concentrations. Particularly, the AMV was put in a tubular furnace, and subjected to heat treatment at 600° C. with one side of the tubular furnace closed and the other thereof closed opened to the air, thereby providing $VO_2$.

It was confirmed the obtained samples were $VO_2$ through observation of crystalline phases by an X-ray diffraction method. It was confirmed that all of the samples included 95 volume % or more of $VO_2$. In the present manufacturing example, the atmosphere created by the air flowing into the furnace and an ammonium gas generated from the AMV was controlled by regulating how the door of the tubular furnace is opened at the opened side, without intentionally introducing the air into the furnace. In this regard, the time of the heat treatment was adjusted in the range of 30 minutes to 4 hours (treatment numbers 1 to 7), thereby preparing vanadium dioxides with different nitrogen concentrations. The increased treatment time accelerated the decomposition to achieve a vanadium oxide with a lower nitrogen concentration, whereas the decreased treatment time achieved a vanadium oxide with a higher nitrogen concentration. The nitrogen contents in the samples were measured by a titration method, from which the nitrogen concentrations in the samples were calculated. Further, the nitrogen contents were also measured with a nitrogen oxide concentration meter ($NO_x$ meter), and it was confirmed that the contents were almost equal in value to the results obtained by the titration method. The nitrogen concentrations of the respective samples are shown in Table 2.

Although the present disclosure is not bound by any theory, the reason that the nitrogen content of 50 to 400 ppm by mass reduces the variation in the amount of heat absorption is considered as follows. Cation impurities such as Mo included in the raw materials decreases the electron correlation of the vanadium oxides, and under this influence, the amount of heat absorption varies.

In this regard, in the presence of nitrogen, the nitrogen is presumed to function as an acceptor, thereby suppressing the decrease in electron correlation, and thus resulting in reduced variability in the amount of heat absorption. On the other hand, in the case of the nitrogen content more than 400

TABLE 1

| | \multicolumn{9}{c}{Element Name} | | | | | | | | |
|---|---|---|---|---|---|---|---|---|---|
| | $Na_2O$ | $Al_2O_3$ | $Cr_2O_3$ | $Fe_2O_3$ | NiO | $MoO_3$ | $Sb_2O_3$ | CaO | $SiO_2$ |
| | \multicolumn{9}{c}{Measurement Method} | | | | | | | | |
| | ICP-MS | ICP-MS | ICP-MS | ICP-MS | ICP-MS | ICP-MS | ICP-MS | ICP-AES | ICP-AES |
| | \multicolumn{9}{c}{Unit} | | | | | | | | |
| | wt % | wt % | wt % | wt % | wt % | wt % | wt % | wt % | wt % |
| Raw Material 1 | 0.006 | 0.007 | 0.001 | 0.005 | ND <0.0005 | 0.004 | ND <0.0005 | 0.005 | 0.020 |
| Raw Material 2 | 0.012 | 0.012 | ND <0.0006 | 0.003 | ND <0.0005 | 0.009 | 0.002 | 0.003 | 0.020 |
| Raw Material 3 | 0.012 | 0.008 | ND <0.0006 | 0.004 | ND <0.0005 | 0.005 | ND <0.0005 | 0.004 | 0.020 |

* ND indicates a concentration less than the detection limit (0.0006 wt % or 0.0005 wt %).

(Evaluation)

Differential Scanning Calorimetry for each of the samples obtained as mentioned above, latent heat was measured in measurement range: sweeping of 0° C.→100° C.→0° C. at rate of temperature increase: 10 K/min in a nitrogen atmosphere with the use of differential scanning calorimetry (DSC). The result is shown in Table 2.

ppm by mass, excess nitrogen is presumed to decrease the electron correlation, thus cause variability, and further decrease the amount of heat absorption.

The cooling device according to the present disclosure can be used as, for example, a cooling device of a small-size communication terminal which has a significant issue with countermeasures against heat.

TABLE 2

| Treatment Number | Nitrogen Concentration (ppm by mass) | Raw Material 1 The Amount of Heat Absorption (J/g) | Raw Material 2 The Amount of Heat Absorption (J/g) | Raw Material 3 The Amount of Heat Absorption (J/g) | Variability (J/g) |
|---|---|---|---|---|---|
| 1# | Over 500 | 31.6 | 40.3 | 50.1 | 18.5 |
| 2 | 376 to 400 | 52.1 | 53.9 | 55.6 | 3.5 |
| 3 | 220 to 224 | 50.7 | 50.2 | 55.6 | 5.4 |
| 4 | 85 to 94 | 51.2 | 52.3 | 56.9 | 5.7 |
| 5 | 50 to 53 | 52.6 | 53.9 | 57.1 | 4.5 |
| 6# | 20 to 21 | 70.2 | 48.9 | 61.3 | 21.3 |
| 7# | N.D. | 71.9 | 49.9 | 62.8 | 22 |

* N.D. indicates a concentration less than the detection limit (20 ppm by mass).
* The treatment numbers 1, 6, and 7 marked with # refer to comparative examples outside the scope of the present disclosure.

As shown in Table 2, it has been confirmed that the nitrogen content affects the variability in the amount of heat absorption. The samples obtained according to the treatment numbers 2 to 5 with the nitrogen contents within the scope of the present disclosure are stable in terms of the amount of heat absorption, with variability at a one-digit level in the amount of heat absorption among the samples obtained through the use of the raw materials 1 to 3, while the samples according to the treatment numbers 6 and 7 with the nitrogen contents less than 50 ppm by mass have variability of 20 J/g or more, and the sample according to the treatment number 1 with the nitrogen content over 400 ppm by mass also has variability of 18.5 J/g.

The invention claimed is:

1. A ceramic material comprising: a vanadium oxide; and 50 to 400 ppm by mass of nitrogen with respect to the vanadium oxide.

2. The ceramic material according to claim 1, wherein the vanadium oxide comprises vanadium and M where M is at least one selected from W, Ta, Mo, and Nb, and an M content in parts by mol is 0 parts by mol or more and approximately 5 parts by mol or less when a total amount of the vanadium and the M is 100 parts by mol.

3. The ceramic material according to claim 1, wherein the vanadium oxide is a composite oxide comprising vanadium and A where A is Li or Na, wherein an A content in parts by mol is approximately 50 parts by mol or more and approximately 110 parts by mol or less when an amount of vanadium is 100 parts by mol.

4. The ceramic material according to claim 1, wherein the vanadium oxide is a composite oxide comprising vanadium and A where A is Li or Na, and at least one transition metal selected from titanium, cobalt, iron, and nickel,
a molar ratio between the vanadium and the transition metal falls within a range of 995:5 to 850:150, and
a molar ratio between a total amount of the vanadium and the transition metal, and A falls within a range of 100:70 to 100:110.

5. The ceramic material according to claim 1, wherein the vanadium oxide comprises one or more oxides represented by the following formula:

$$V_{1-x}M_xO_2$$

wherein, in the formula, M is W, Ta, Mo, or Nb, and x is 0 or more and 0.05 or less,
or the following formula:

$$A_yV_{1-z}M^a_zO_2$$

wherein, in the formula, A is Li or Na, and $M^a$ is a transition metal; and y is 0.5 or more and 1.1 or less, and z is 0 or more and 0.15 or less.

6. The ceramic material according to claim 1, wherein the vanadium oxide comprises one or more oxides represented by the following formula:

$$V_{1-x}M_xO_2$$

wherein, in the formula, M is W, Ta, Mo, or Nb, and x is 0 or more and 0.05 or less.

7. The ceramic material according to claim 1, wherein the vanadium oxide is a vanadium oxide doped with Ti, or further doped with another atom selected from the group consisting of W, Ta, Mo, and Nb,
when the another atom is W, a content of the another atom in parts by mol is more than 0 parts by mol and 5 parts by mol or less with respect to 100 parts by mol in total of the vanadium, the Ti, and the another atom,
when the another atom is Ta, Mo, or Nb, the content of the another atom in parts by mol is more than 0 parts by mol and 15 parts by mol or less with respect to 100 parts by mol in total of the vanadium, the Ti, and the another atom, and
a titanium content in parts by mol is 2 parts by mol or more and 30 parts by mol or less with respect to 100 parts by mol in total of the vanadium, the Ti, and the another atom.

8. The ceramic material according to claim 7, wherein the titanium content in parts by mol is 5 parts by mol or more and 10 parts by mol or less with respect to 100 parts by mol in total of the vanadium, the Ti, and the another atom.

9. The ceramic material according to claim 1, wherein the vanadium oxide comprises one or more oxides represented by the following formula:

$$V_{1-x-y}Ti_xM_yO_2$$

wherein, in the formula, M is W, Ta, Mo, or Nb,
x is 0.02 or more and 0.30 or less,
y is 0 or more, and
y is 0.05 or less when M is W, or
y is 0.15 or less when M is Ta, Mo, or Nb.

10. The ceramic material according to claim 9, wherein x is 0.05 or more and 0.10 or less.

11. A cooling device comprising the ceramic material according to claim 1.

12. An electronic component comprising the cooling device according to claim 11.

13. An electronic device comprising one of the cooling device according to claim 11 and the electronic component according to claim 12.

14. A cooling device comprising the ceramic material according to claim 2.

15. A cooling device comprising the ceramic material according to claim 3.

16. A cooling device comprising the ceramic material according to claim 4.

17. A cooling device comprising the ceramic material according to claim 5.

18. A cooling device comprising the ceramic material according to claim 6.

19. A cooling device comprising the ceramic material according to claim 7.

20. A cooling device comprising the ceramic material according to claim 8.

* * * * *